United States Patent [19]

Yee et al.

[11] Patent Number: 5,045,729

[45] Date of Patent: Sep. 3, 1991

[54] TTL/ECL TRANSLATOR CIRCUIT

[75] Inventors: Loren Yee, Milpitas; Nguyen X. Sinh, San Jose, both of Calif.

[73] Assignee: National Semiconductor Corporation, Santa Clara, Calif.

[21] Appl. No.: 436,842

[22] Filed: Nov. 15, 1989

[51] Int. Cl.[5] ............................................ H03K 19/08
[52] U.S. Cl. .................................. 307/475; 307/310; 307/443; 307/544; 307/552
[58] Field of Search ............... 307/310, 475, 443, 544, 307/552

[56] References Cited

U.S. PATENT DOCUMENTS

| 3,758,791 | 9/1973 | Taniguchi et al. | 307/310 |
| 4,329,597 | 5/1982 | Yamagiwa | 307/310 |
| 4,533,842 | 8/1985 | Yang et al. | 307/475 |
| 4,607,177 | 8/1986 | Lechner | 307/475 |
| 4,654,549 | 3/1987 | Hannington | 307/475 |
| 4,687,953 | 8/1987 | Vardarajan | 307/443 |
| 4,736,125 | 4/1988 | Yuen | 307/475 |
| 4,771,191 | 9/1988 | Estrada | 307/475 |
| 4,806,800 | 2/1989 | Khan | 307/475 |
| 4,871,929 | 10/1989 | Hollstein et al. | 307/455 |
| 4,928,025 | 5/1990 | Kokado | 307/544 |

Primary Examiner—David Hudspeth
Assistant Examiner—Scott A. Ouellette
Attorney, Agent, or Firm—Lee Patch; Robert C. Colwell

[57] ABSTRACT

A TTL/ECL translation circuit for translating TTL level input signals, which have a high voltage state and a low voltage state, to ECL level output signals, which have a high voltage state and a low voltage state. The translation circuit includes a TTL input circuit, a level shifter, and an ECL output circuit connected in series. The TTL input circuit receives the TTL level input signals and generates a first intermediate signal, corresponding to the TTL level input signals, that is transmitted to the level shifter. The level shifter receives the first intermediate signal and generates a second intermediate signal corresponding to the first intermediate signal that is transmitted to the ECL output circuit. The ECL output circuit receives the second intermediate signal and generates an ECL output signal corresponding to the second intermediate signal and the TTL input signal.

13 Claims, 3 Drawing Sheets

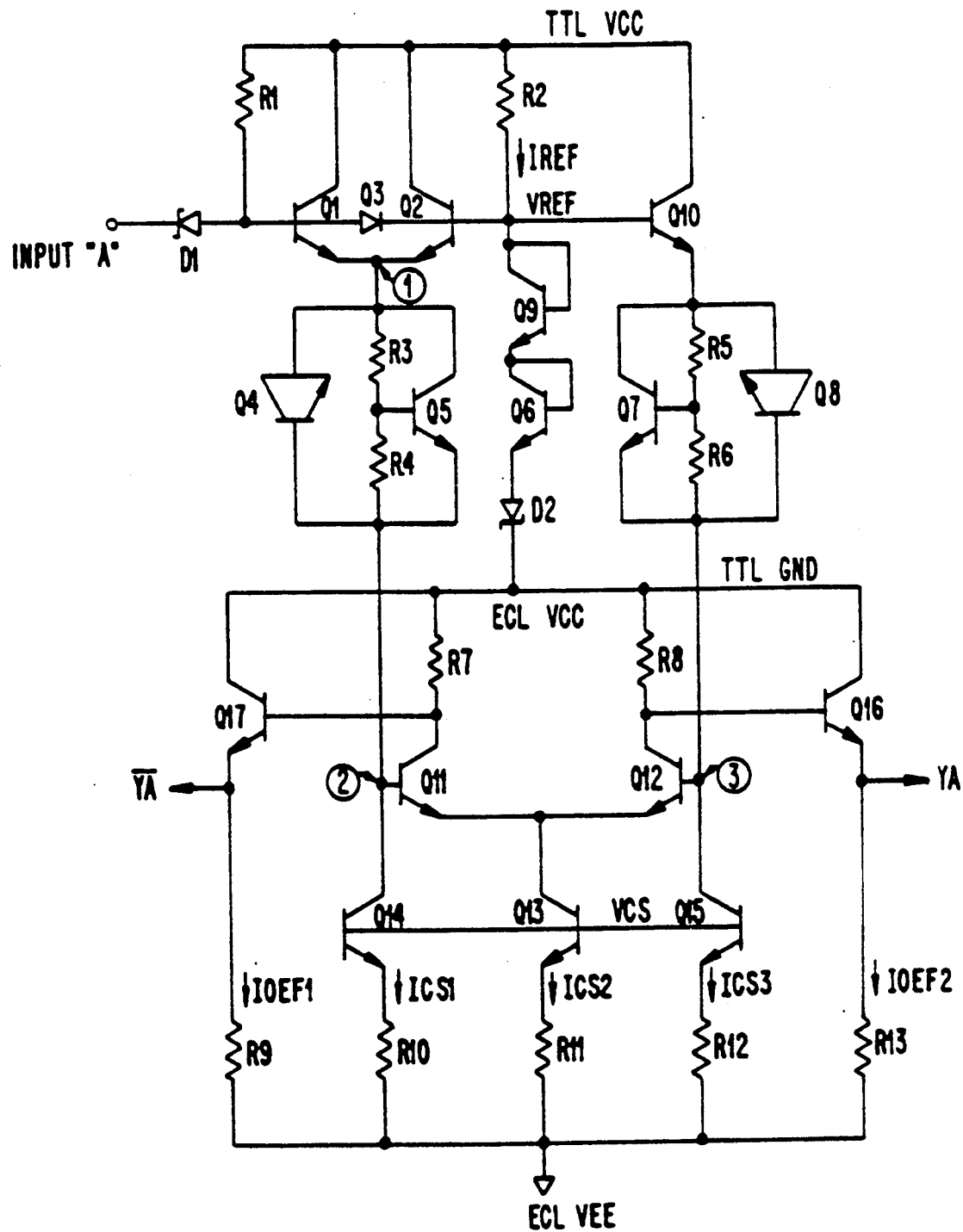
FIG._1
(PRIOR ART)

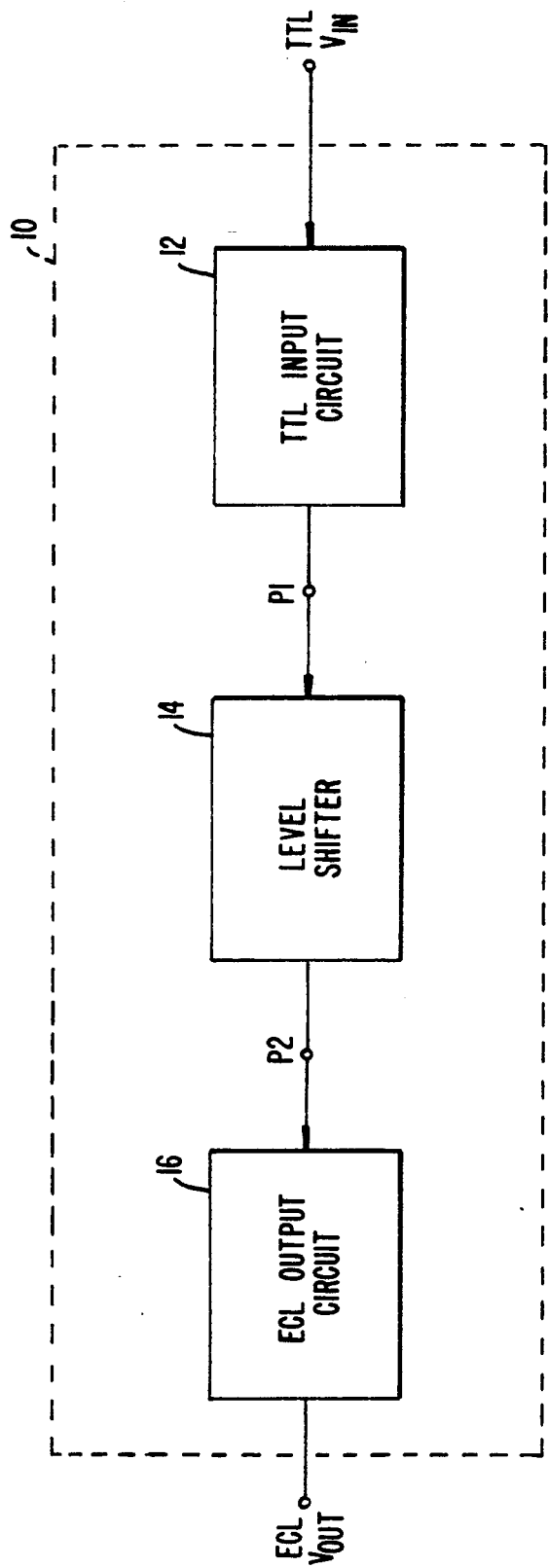
FIG._2.

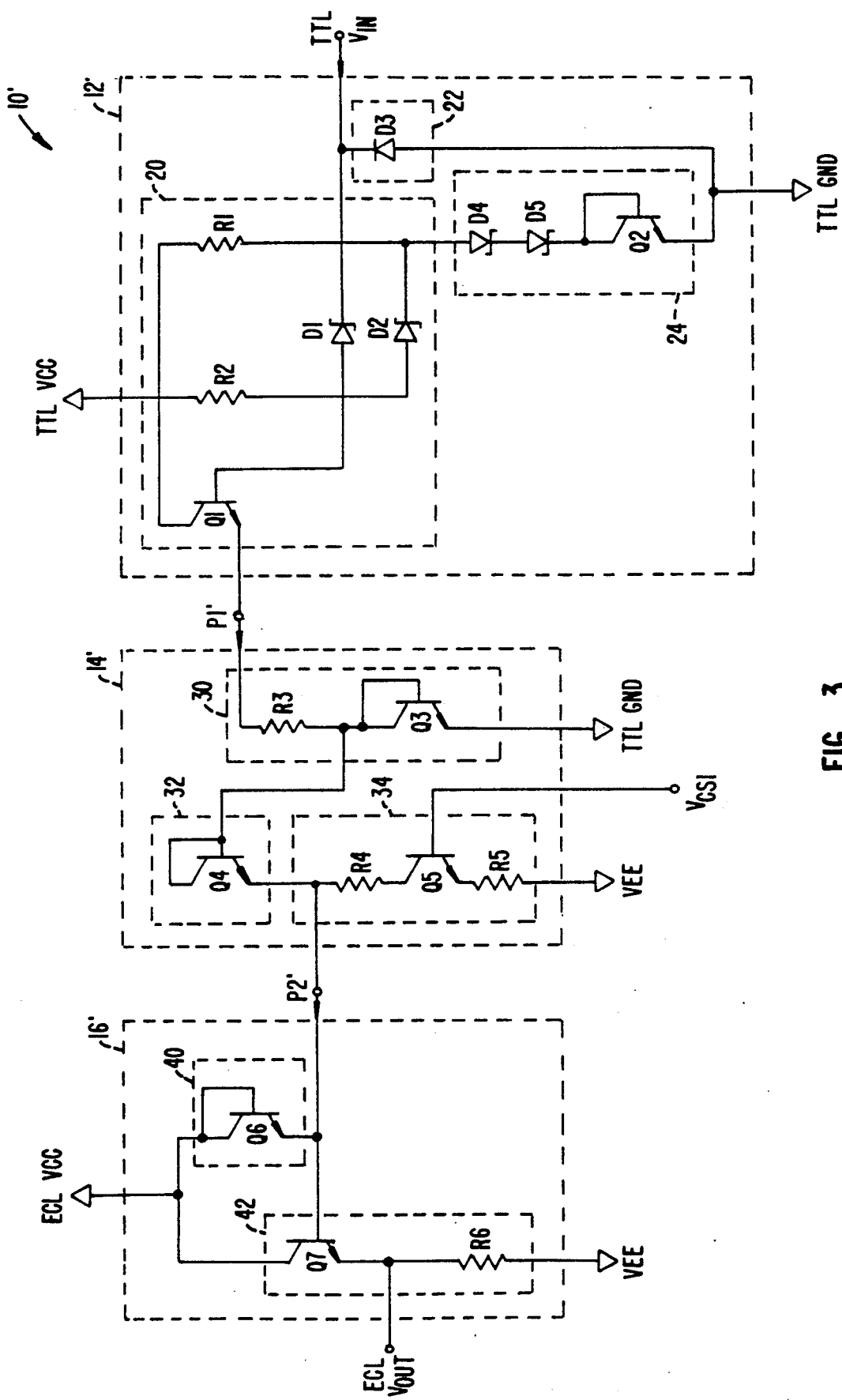
FIG._3.

TTL/ECL TRANSLATOR CIRCUIT

CROSS-REFERENCE TO RELATED APPLICATIONS

Related co-pending applications include "ECL/TTL Tri-State Buffer" filed Nov. 15, 1989, Ser. No. 436,846 and "ECL/TTL Translator Circuit", filed Nov. 15, 1989, Ser. No. 437,473.

BACKGROUND OF THE INVENTION

The present invention relates generally to translator circuits, and more specifically, to transistor-transistor logic (TTL) to emitter coupled logic (ECL) translator circuits for receiving TTL voltage level input signals and generating ECL voltage level output signals.

TTL circuitry and ECL circuitry are two well-known types of digital circuitry for use in computers and other logic devices. In TTL circuitry a binary "1" is represented by a high voltage level between 2.5 and 5 volts, and a binary "0" is represented by a low voltage level between 0 and 0.8 volts. TTL circuitry is generally known for having high speed and low power requirements.

ECL circuitry generally operates at negative voltage with the high and low level voltage signals established on either side of a negative reference voltage. For example, if a reference voltage is $-1.2$ volts, a binary "1" may be represented by a voltage level of $-0.8$ volts and a binary "0" may be represented by a voltage level of $-1.2$ volts. ECL circuitry is generally known for higher speed switches.

To obtain the advantages of both TTL and ECL circuitry and devices, translators are required for translating the binary data from the TTL voltage level to the ECL voltage level.

One such TTL to ECL translator is illustrated in FIG. 1 as disclosed in U.S. Pat. No. 4,806,800. A TTL input signal is received at input node "A," and a corresponding ECL output signal is generated at node YA. This device includes a TTL input clamped level shifting comparator (transistors Q1, Q2 and Q3 plus resistor R1), a self-centering reference threshold translator (transistors Q7, Q8, Q10 and Q15 plus resistors R5, R6 and R12), a clamped level shifted input translator (transistors Q4, Q5 and Q14 plus resistors R3, R4 and R10), and an ECL Buffer Driver (transistors Q11, Q12 and Q13 plus resistors R7, R8 and R11). However, as with many other TTL to ECL translators, this circuit is large, slow, and inefficient. The number of resistors and switches and the large internal voltage swing slow the circuit. In addition, the large number of devices, especially resistors, increases the required area for the circuit and causes the circuit to dissipate a large amount of power.

SUMMARY OF THE INVENTION

The present invention provides a TTL/ECL translation circuit for translating TTL level input signals, which have a high voltage state and a low voltage state, to ECL level output signals, which have a high voltage state and a low voltage state.

The translation circuit includes a TTL input circuit, a level shifter, and an ECL output circuit coupled in series. The TTL input circuit receives the TTL level input signals and generates a first intermediate signal, corresponding to the TTL level input signals, that is transmitted to the level shifter. The level shifter receives the first intermediate signal and generates a second intermediate signal corresponding to the first intermediate signal that is transmitted to the ECL output circuit. The ECL output circuit receives the second intermediate signal and generates an ECL output signal corresponding to the second intermediate signal and the TTL input signal.

The TTL input circuit includes a TTL input buffer for receiving the TTL level input signals and for generating the first intermediate signals. The TTL input circuit also includes an input clamp for preventing the TTL input signals from causing voltage ringing in the TTL input buffer.

The level shifter includes an intermediate translation circuit, an ECL current source, and a preliminary level shifter. The intermediate translation circuit generates a second intermediate signal corresponding to the first intermediate level signal. The ECL current source provides current to the translation circuit. The preliminary level shifter receives the first intermediate signal and shifts the signal to a slightly lower voltage for the intermediate translation circuit. This lowers the amount of voltage differential across the intermediate translation circuit, thereby decreasing problems of voltage breakdown and leakage. The level shifter is primarily composed of resistors and diode connected transistors in series, thereby further decreasing the problems of voltage breakdown and leakage.

The ECL output circuit includes an ECL output driver for generating an ECL output signal that corresponds to the second intermediate signal and the TTL input signal. In addition, the ECL output circuit includes a low level clamp for preventing the ECL output driver from generating a continuous low voltage ECL output signal. Furthermore, the ECL output circuit is able to drive high capacitance loads.

A further understanding of the nature and advantages of the invention may be realized by reference to the remaining portions of the specification and the attached drawings.

BRIEF DESCRIPTION OF THE DRAWINGS

FIG. 1 is a schematic diagram of a TTL to ECL translator as disclosed in U.S. Pat. No. 4,806,800;

FIG. 2 is a block diagram of a preferred embodiment of the invention; and

FIG. 3 is a schematic diagram of a preferred embodiment of the invention.

DETAILED DESCRIPTION OF THE PREFERRED EMBODIMENTS

FIG. 2 is a block diagram of a preferred TTL/ECL translator circuit 10 that receives a TTL input signal and generates an ECL output signal. The TTL/ECL translator circuit includes a TTL input circuit 12, a level shifter 14, and an ECL output circuit 16.

TTL input circuit 12 receives and buffers the TTL input signal received at node TTL Vin. In response, the TTL input circuit generates a first intermediate signal corresponding to the TTL input signal that is transmitted to a level shifter 14 via first intermediate voltage node P1. The level shifter generates a second intermediate signal that corresponds to the first intermediate signal, but is at a lower voltage than the first intermediate signal. The level shifter then transmits the second intermediate signal to ECL output circuit 16 via second intermediate voltage node P2. In response, the ECL output circuit generates and transmits an ECL output signal that corresponds to the second intermediate signal and, therefore, corresponds to the TTL input signal.

FIG. 3 is a schematic diagram of a preferred TTL/ECL translator circuit 10' that includes a TTL input circuit 12', a first intermediate voltage node P1', a level shifter 14', a second intermediate voltage node P2' and an ECL output circuit 16' corresponding to the elements of the block diagram shown in FIG. 2.

TTL input circuit 12' includes a TTL input buffer 20, an input clamp 22 and a TTL input threshold circuit 24. TTL input buffer 20 receives TTL input signals, and generates a corresponding first intermediate signal. Input clamp 22 is coupled to the TTL input buffer for preventing the TTL input signals from causing voltage ringing in the TTL input buffer. TTL input threshold circuit 24 is coupled to the TTL input buffer and provides a threshold voltage level between a TTL high and a TTL low. This threshold voltage level is utilized by the TTL input buffer for generating the first intermediate signal corresponding to the TTL input signal.

In the preferred embodiment, the TTL input buffer includes resistors R1 and R2 and transistor Q1 in parallel and coupled to TTL VCC (approximately 5.0 volts). In addition, the TTL input buffer includes zener diodes D1 and D2 in parallel between resistors R1 and R2. Input clamp 22 includes diode D3 between TTL Vin and TTL ground. TTL input threshold circuit 24 includes zener diodes D4 and D5 and transistor Q2 connected as a diode in series between TTL Vin and TTL ground.

Upon receiving a TTL input signal, which is in a low state (voltage less than 0.8 volts), diodes D4 and D5 and transistor Q2 connected as a diode are off and therefore, not pulling current. However, diodes D1 and D2 are on and pulling current through R2. Because this current is being pulled, the voltage at the base and emitter of Q1 drops resulting in a first intermediate signal voltage of approximately 1.4 volts at node P1.

If the TTL input signal voltage is in a high state (voltage greater than 2.4 volts), then diodes D4 and D5 and transistor Q2 are on and pulling current through resistor R1. As a result, the first intermediate signal voltage of approximately 3.2 volts at node P1'.

Level shifter 14' includes a preliminary voltage shifter 30, an intermediate translation circuit 32, and an ECL current source 34. Preliminary voltage shifter 30 receives the first intermediate signal from node P1' and shifts the signal to a slightly lower voltage. Intermediate translation circuit 32 is coupled to the TTL level shifter and generates a second intermediate signal that is transmitted to node P2'. ECL current source 34 is coupled to intermediate translation circuit 32 and provides a current source for the intermediate translation circuit.

In the preferred embodiment, preliminary voltage shifter 30 includes resistor R3 and diode connected transistor Q3 connected as a diode in series between node P1' and TTL ground. In addition, intermediate translation circuit 32 includes a transistor Q4 connected as a diode. Furthermore, ECL current source 34 includes resistor R4, transistor Q5 and resistor R5 in series between node P2' and VEE (approximately −1.6 volts). The base of transistor Q5 is connected to reference voltage VCSI which is approximately 0.4 volts above VEE.

Upon receiving a first intermediate signal on node P1' that has a low voltage state of approximately 1.4 volts, the preliminary voltage shifter shifts the signal down approximately 0.9 volts across R3. Transistor Q4 then causes the voltage to drop another approximately 1.3 volts resulting in a second intermediate voltage of approximately −0.8 volts at node P2'. If the first intermediate signal has a high voltage state of approximately 3.5 volts, then the TTL level shifter drops the voltage down approximately 0.9 volts across R3 transistor Q4 dropping the voltage down further to approximately 0 volts at P2'.

ECL output circuit 16' includes a low level clamp 40 and an ECL output driver 42. Low level clamp 40 is coupled to the ECL output driver to prevent the ECL output driver from entering a constant low state. Such a constant low state may occur due to device variation during manufacturing. ECL output driver 42 is coupled to node P2' and generates an ECL output signal at ECL Vout corresponding to the incoming second intermediate signal on node P2'. Of course, this ECL output signal corresponds to the incoming TTL input signal at TTL Vin.

In the preferred embodiment, the low level clamp includes a transistor connected as a diode between ECL VCC and node P2'. In addition, the ECL output driver includes transistor Q7 and resistor R6 between ECL VCC (approximately −0.8 volts) and VEE with the base of transistor Q7 connected to node P2'.

Upon receiving a second intermediate signal that is in a low state (voltage approximately −0.8 volts), transistor Q7 drops the voltage level down to approximately −1.6 volts (an ECL low signal). Upon receiving a second intermediate signal in a high state (approximately 0 volts) transistor Q7 drops the voltage level down to approximately −0.8 volts (an ECL high signal). As a result, the ECL output circuit is generating an ECL output signal that corresponds to the TTL input signal received by the TTL input circuit.

As will be understood by those familiar with the art, the present invention may be embodied in other specific forms without departing from the spirit or essential characteristics thereof. For example, diodes may be substituted for the transistors connected as diodes. For another example, the TTL GND and the ECL GND may be shorted together to reduce noise. Accordingly, the disclosure of the preferred embodiment of the invention is intended to be illustrative, but not limiting, of the scope of the invention which is set forth in the following claims.

What is claimed is:

1. A circuit for translating TTL level input signals, which have a high voltage state and a low voltage state, to ECL level output signals, which have a high voltage state and a low voltage state, the circuit comprising:

(a) first and second voltage nodes;

(b) TTL input means, coupled to the first voltage node, for receiving the TTL level input signals and for generating a first intermediate voltage at the first voltage node corresponding to the TTL level input signals;

(c) a level shifter, coupled to the first and second voltage nodes, responsive to the first intermediate voltage, for generating a second intermediate voltage at the second voltage node corresponding to the first intermediate voltage; and (d) ECL output means, coupled to the second voltage node, responsive to the second intermediate voltage, for generating ECL level output signals corresponding to the second intermediate voltage, thereby providing ECL level output signals corresponding to TTL level input signals.

2. The circuit of claim 1 wherein the TTL input means comprises:
   (a) a TTL input buffer, coupled to the first voltage node, for receiving the TTL level input signals and for generating a first intermediate voltage at the first voltage node corresponding to the TTL level input signals; and
   (b) an input clamp, coupled to the TTL input buffer, for preventing the TTL level input signals from causing voltage ringing in the TTL input buffer.

3. The circuit of claim 2 wherein the TTL input buffer includes a TTL input threshold means for providing a threshold voltage level between a TTL high voltage level and a TTL low voltage level.

4. The circuit of claim 1 wherein the level shifter comprises:
   (a) an intermediate translation means, coupled to the first and second voltage nodes, responsive to the first intermediate voltage, for generating a second intermediate voltage at the second voltage node corresponding to the first intermediate voltage; and
   (b) an ECL current source, coupled to the intermediate translation means, for providing current to the intermediate translation means.

5. The circuit of claim 4 wherein the intermediate translation means includes a translation diode.

6. The circuit of claim 5 wherein the translation diode comprises a transistor connected as a diode.

7. The circuit of claim 4 wherein the level shifter further comprises a preliminary voltage shifter coupled to the first voltage node and the intermediate translation means for decreasing the voltage signal provided to the intermediate translation means.

8. The circuit of claim 7 wherein the preliminary voltage shifter means comprises a resistor and a diode.

9. The circuit of claim 1 wherein the ECL output means comprises:
   (a) an ECL output driver, coupled to the second voltage node, responsive to the second intermediate voltage, for generating ECL level output signals at the ECL output node corresponding to the second intermediate voltage; and
   (b) a low level clamp, coupled to the second voltage node, for preventing the ECL output driver from generating a continuous low voltage ECL output signal.

10. The circuit of claim 9 wherein the low level clamp comprises a diode.

11. The circuit of claim 10 wherein the diode comprises a transistor connected as a diode.

12. A circuit for translating TTL level input signals, which have a high voltage state and a low voltage state, to ECL level output signals, which have a high voltage state and a low voltage state, the circuit comprising:
   (a) first and second voltage nodes;
   (b) a TTL input buffer, coupled to the first voltage node, for receiving the TTL level input signals and for generating a first intermediate voltage at the first voltage node corresponding to the TTL level input signals;
   (c) a translation means, coupled to the first and second voltage nodes, responsive to the first intermediate voltage, for generating a second intermediate voltage at the second voltage node corresponding to the first intermediate voltage;
   (d) an ECL current source, coupled to the translation means, for providing current to the translation means;
   (e) an ECL output driver, coupled to the second voltage node, responsive to the second intermediate voltage, for generating ECL level output signals at the ECL output node corresponding to the second intermediate voltage; and
   (f) a low level clamp, coupled to the second voltage node and the ECL output driver, for preventing the ECL output driver from generating a continuous low voltage ECL output signal.

13. The circuit of claim 12 further comprising a preliminary voltage shifter coupled to the first voltage node and the translation means for decreasing the voltage signal provided to the translation means.

* * * * *